US 6,731,507 B2

United States Patent
Varghese et al.

(10) Patent No.: US 6,731,507 B2
(45) Date of Patent: May 4, 2004

(54) MODULAR AC INPUT SECTION FOR A POWER SUPPLY UNIT

(75) Inventors: Paily T. Varghese, Houston, TX (US); Robert J. Hastings, Kingwood, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 16 days.

(21) Appl. No.: 09/964,306

(22) Filed: Sep. 26, 2001

(65) Prior Publication Data
US 2003/0058613 A1 Mar. 27, 2003

(51) Int. Cl.[7] .................................................. G06F 1/16
(52) U.S. Cl. ........................ 361/725; 361/683; 361/733; 312/223.2
(58) Field of Search ................................ 361/683, 686, 361/695, 725, 733; D13/110; 363/65–67, 142, 146, 178; 439/532; 312/223.1, 223.2

(56) References Cited

U.S. PATENT DOCUMENTS

| | | | | |
|---|---|---|---|---|
| 4,652,769 A | * | 3/1987 | Smith et al. .................. 307/31 |
| 5,940,274 A | * | 8/1999 | Sato et al. .................. 361/725 |
| 5,973,947 A | * | 10/1999 | Shih ........................... 363/144 |
| 6,175,503 B1 | * | 1/2001 | Hogan et al. ............... 361/733 |
| 6,456,203 B1 | * | 9/2002 | Schomaker et al. ........ 340/638 |

* cited by examiner

Primary Examiner—Darren Schuberg
Assistant Examiner—Anthony Q. Edwards

(57) ABSTRACT

A power supply unit includes a housing in which one or more power supply modules can be inserted and a modular AC input section. The modular AC input section preferably attaches to the distal end of the housing from where the power supply modules are inserted. The AC input section includes one or more circuit breakers, connectors and wiring connecting the breakers to the connectors. The connectors preferably comprise blind mating connectors that mate with corresponding connectors on the rear surface of the power supply modules. The AC input section is screwed to the power supply housing or attached through some other suitable means. The AC input section is modular in the sense that it can be easily and quickly removed from the power supply unit and replaced with another section. This permits upgrades and repairs to be made in a quick, cost effective manner.

23 Claims, 4 Drawing Sheets

MODULAR AC INPUT SECTION FOR A POWER SUPPLY UNIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to a power supply unit for a plurality of computer equipment (e.g., a rack of computers). More particularly, the invention relates to a power supply unit for a rack of computers that has a modular alternating current ("AC") section which facilitates servicing and maintaining the power supply unit.

2. Background of the Invention

Computer equipment is often deployed in a "rack." Generally, a rack is a structure in which one or more computers, electronic switches, and other such equipment is installed. Racks are particularly useful to organizations that require a great deal of computing capability, such as Internet Service Providers ("ISPs"), Application Service Providers ("ASPs"), various corporations with relatively large internal networks and the like.

Because it is possible that a piece of equipment in a rack may fail, it may be necessary to be able to replace the components of a rack. Also, it may be desirable to replace older model components with newer, improved versions of that component. Replacement of a component typically requires disconnecting various electrical cables. As computer equipment has become smaller, it has become possible to place many more components in a rack than previously feasible. However, as more components have been placed into a rack, it has become increasingly more difficult to service and maintain the rack. For instance, the number of cables alone has increased dramatically to the point where it can be very difficult to remove a computer due to the vast web cables typical of many computer racks.

Thus, removing an old component and installing a new component can be a very time consuming task and thus expensive (in terms of labor cost and lost computing time), particularly for an organization that may have numerous racks, each requiring such maintenance activity. Anything that can be done to make a rack of equipment easier and faster to maintain is thus highly desirable.

BRIEF SUMMARY OF THE INVENTION

The problems noted above are solved in large part by a modular AC input section for a power supply unit. The power supply unit preferably includes a housing in which one or more power supply modules and the modular AC input section can be inserted. The modular AC input section preferably attaches to the distal end of the housing from where the power supply modules are inserted. The AC input section includes one or more circuit breakers, connectors and wiring that connects the breakers to the connectors. The connectors preferably comprise blind mating connectors that mate with corresponding connectors on the rear surface of the power supply modules. The AC input section is attached to the power supply housing via screws or using some other suitable attachment mechanism.

The AC input section is modular in the sense that it can be easily and quickly removed from the power supply unit and replaced with another section. This permits upgrades and repairs to be made in a quick and cost effective manner. These and other advantages will become apparent upon reviewing the following description in relation to the accompanying drawings.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either a direct or indirect electrical connection. Thus, if a first device couples to a second device, that connection may be through a direct electrical connection, or through an indirect electrical connection via other devices and connections. To the extent that any term is not specially defined in this specification, the intent is that the term is to be given its plain and ordinary meaning.

DETAILED DESCRIPTION OF THE PREFERRED EMBODIMENTS

Figure 1:
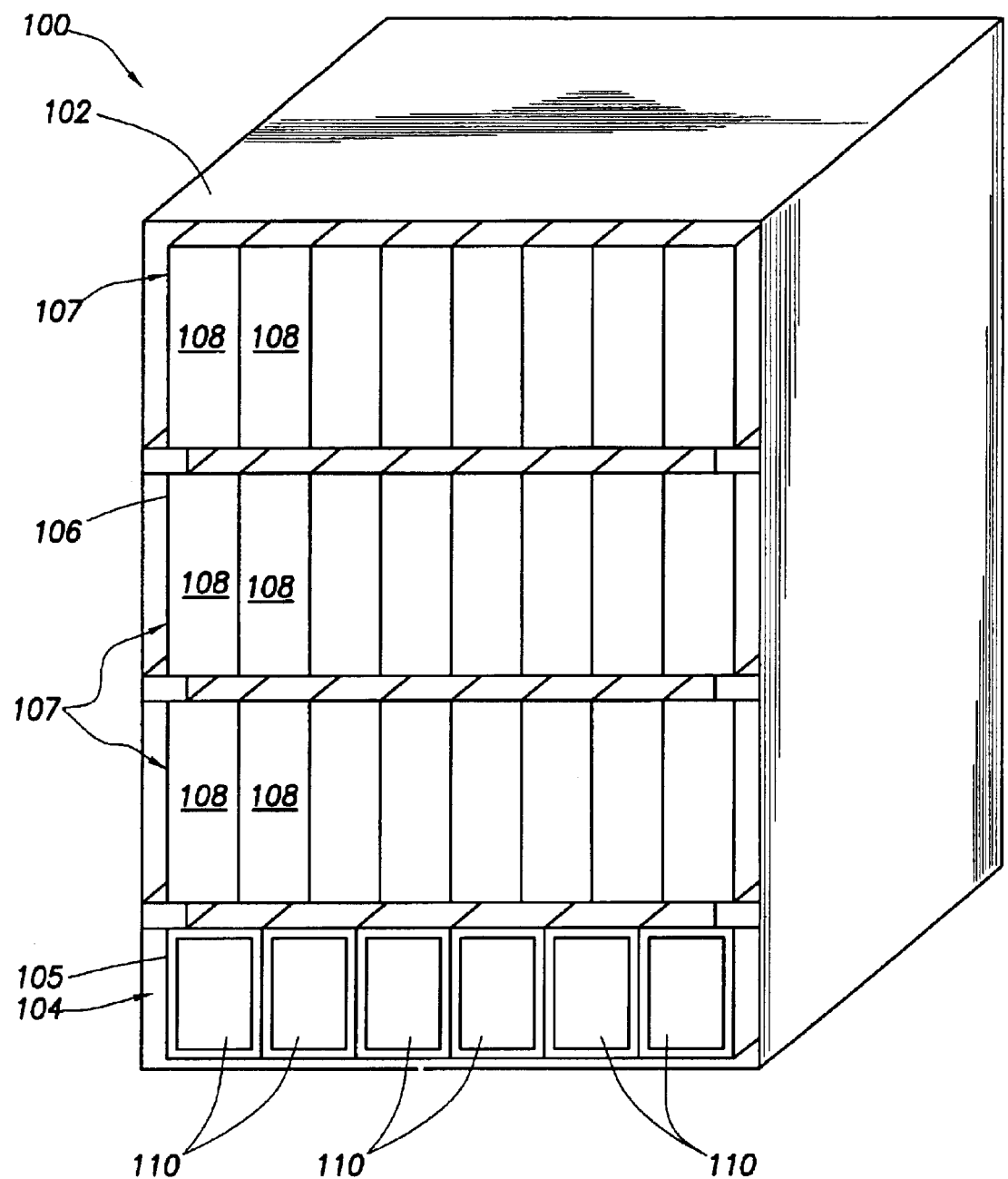
FIG. 1 shows a front view of rack including a power supply unit constructed in accordance with a preferred embodiment of the invention.

Referring now to FIG. 1, computer system 100, constructed in accordance with a preferred embodiment of the invention, comprises a support structure 102 (e.g., a rack) capable of housing and interconnecting various items of electrical equipment. The electrical equipment may include one or more server units 107 each comprising a housing 106 capable of receiving one or more server computers 108. In the exemplary embodiment shown in FIG. 1, each server housing 106 can receive up to eight servers 108. Rack 102 also includes a power supply unit 104. The power supply unit 104 preferably comprises a housing 105 capable of receiving one or more power supply modules 110. Similar to the server housing 106, the power supply housing 105 preferably is capable of accommodating as many as six power supplies. Of course, it should be appreciated that the rack 102 and housings 105, 106 can be modified to accommodate any number of servers 108 and power supply modules 110. Also, the rack can be modified to accommodate any desired number of power supply and server housings 105, 106.

Preferably, the power supply and server housings 105, 106 mount inside the rack 102 using various screws or other types of attachment mechanisms. The servers 108 and power supply modules 110 slide into their respective housings either before or after the housings are attached to the rack 102. The servers and power supply modules preferably include blind mating connectors at their distal end (not specifically shown in FIG. 1) that permit the servers and power supply modules to be easily removed and replaced.

Figure 2:
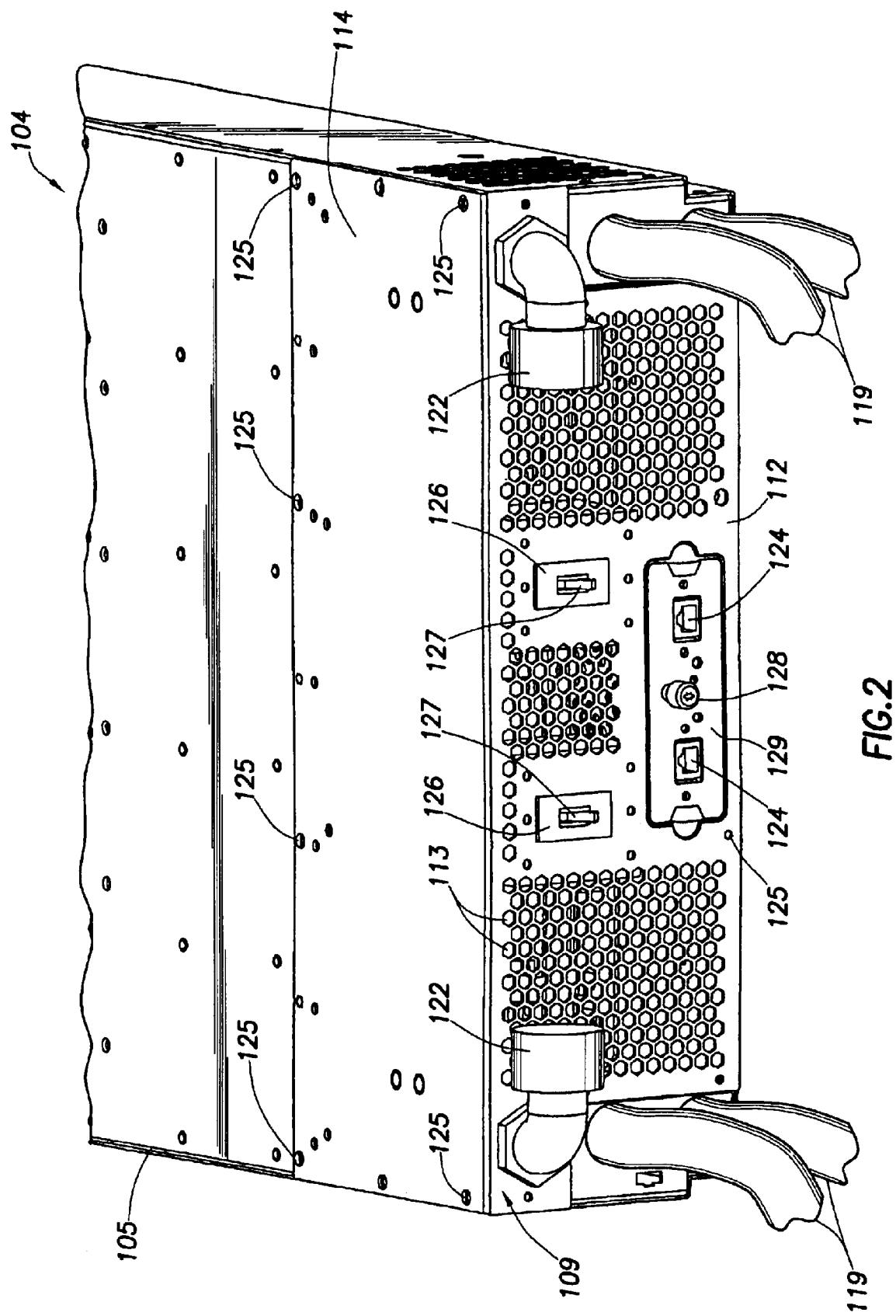
FIG. 2 shows a rear view of the power supply unit of FIG. 1.

Turning now to FIG. 2, the rear portion of the power supply unit 104 is shown apart from the rack 102. As shown, preferably two alternating current ("AC") cable adapters 122 are provided to receive 120 VAC power to the power supply unit 104 via a pair of AC cables (not shown). Two AC power feeds may be used as shown for redundancy or other purposes. As will be shown in more detail in FIG. 3, the power supply unit includes circuit breakers, wiring and connectors which provide the AC power to the individual power supply modules 110 (FIG. 1). The circuit breakers, wiring and connectors (and other components) are mounted on an AC input section 109 which mounts on the power supply unit 104 at the rear portion of the unit.

The AC input section 109 preferably includes a back 112 and top 114. The back 112 and top 114 includes a plurality of holes through which screws 125 (or other types of attachment mechanisms) are inserted to mate the AC input section 109 to the housing 105. The back 112 preferably is perforated by perforations 113 as shown to permit air flow around and through the power supplies 110 to thereby assist in removing heat from the power supply modules 110. A pair of circuit breakers 126 are shown protruding through the back 112 of the AC input section 109. As is well known, circuit breakers open a circuit when the level of current in the circuit exceeds a predetermined threshold. The breakers 126 can be reset by toggling the switches 127 protruding through back 112.

A communication board 129 may also insert through the back 112 of the AC input section 109 and be retained by threaded thumb screw 128 or other suitable means. The communication board 129 may provide digital communications between the power supplies contained within the power supply unit 104 and other components in the rack 102 for control and status purposes. Communication board 129 preferably includes two digital communication ports 124 by which other equipment in the rack can communicate with the power supplies.

Figure 3:
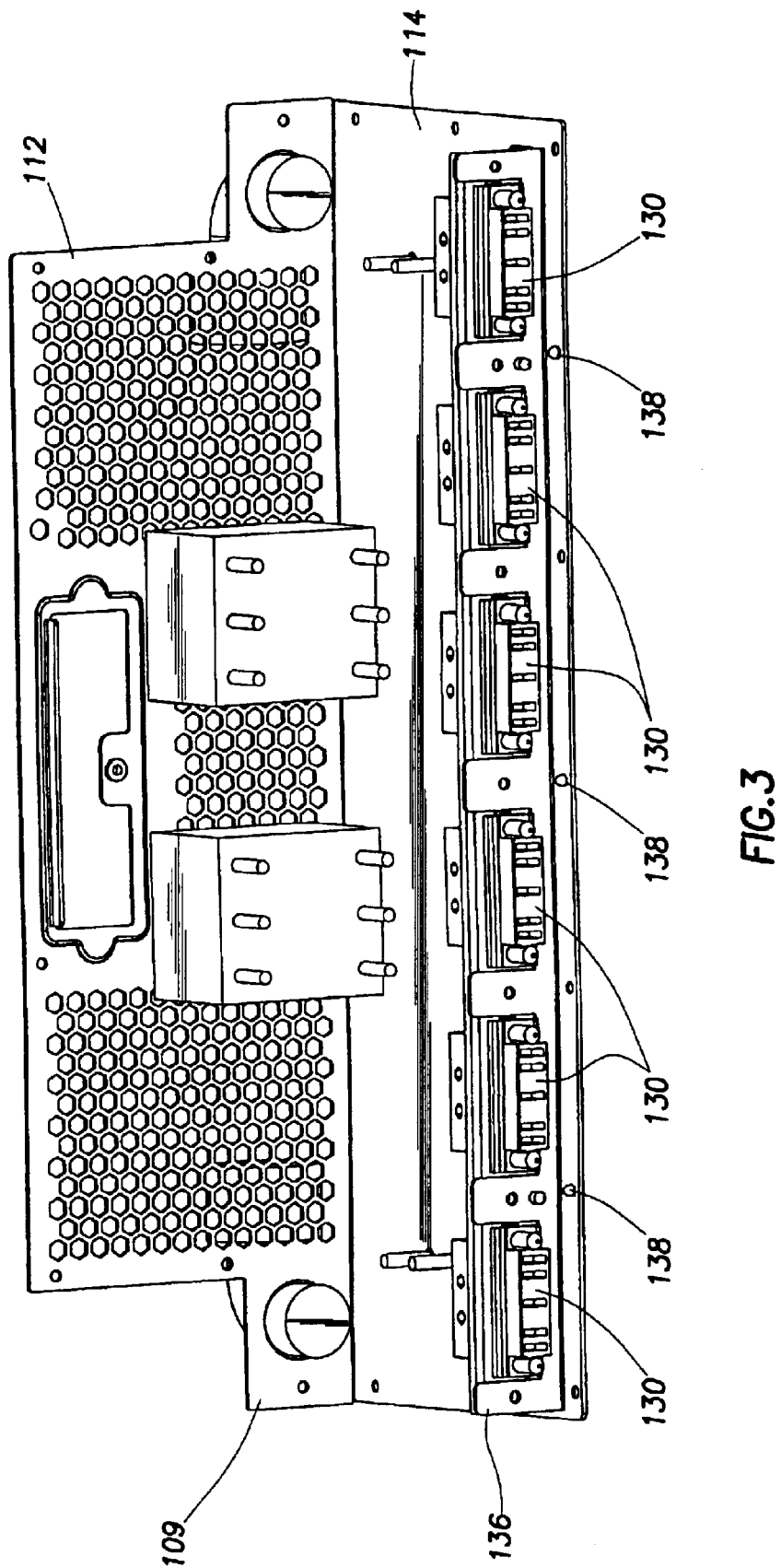
FIG. 3 shows a modular AC section of the power supply unit.

Referring now to FIG. 3, AC input section 109 is shown inverted from its orientation in FIG. 2 to better illustrate its components. One or more circuit breakers 126 are mounted to the back 112 using conventional mounting mechanisms such as screws and the like. Alternatively, the circuit breakers 126 may be mounted to the top 114. A riser bar 136 is attached to the underside of top 114. The riser bar 136 preferably is attached by welding (or other suitable technique) to the top 114. In the embodiment of power supply unit 104 shown in the drawings, riser bar 136 includes six openings 131 through which six corresponding blind mating connectors 130 are mounted. Each connector 130 is used to provide AC power from breakers 126 to a corresponding power supply module 110.

The AC input section 109 preferably also includes one or more locator posts 138 which fit into corresponding recesses (not shown in housing 105). These locator posts 138 permit the AC input section 109 to be quickly and easily aligned when attaching it to the housing.

Conventional power supply units often are constructed in such a manner that the power supplies are wired directly to the AC input power. This makes it difficult and time consuming to change parts of the power supply unit, such as the circuit breakers, wiring, and the like. AC input section 109 advantageously is a modular piece that can be easily removed and replaced thereby solving the problems of conventional power supply units. By being a modular piece, AC input section 109 can be removed and replaced in its entirety easily and quickly in the field by a fairly unskilled technician. Such a technician would simply have to remove any power supply modules 110 and all retaining screws 125 (FIG. 2), remove the old AC input section 109 and insert a new AC input section 109. Thus, if a wire or a circuit breaker malfunctions, for example, repairing the problem is easy and straightforward.

Being able to easily and quickly replace the entire AC input section 190 also advantageously permits changes in the AC power distribution to be quickly effectuated. For example, various polyphase AC power distribution wiring can be implemented by various AC input sections 109. For example, a power supply unit's present AC input section 109 may be wired for two phase distribution. If desired, the current AC input section 109 may be easily replaced with a different AC input section wired for three phase power distribution. Also, if circuit breakers rated for different current levels are desired, the current AC input section can be replaced with a section that uses circuit breakers having the desired rating. These types of changes can be easily and quickly made in the field by unskilled technicians.

Figure 4:
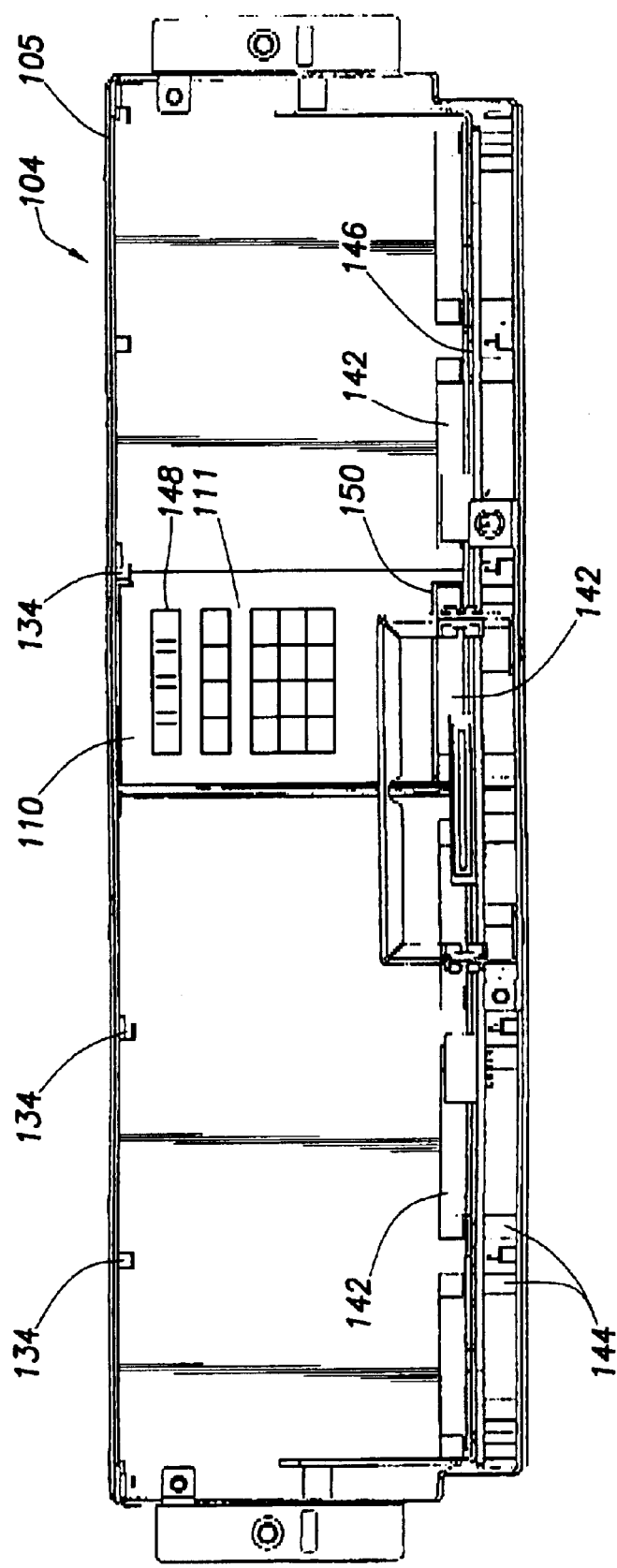
FIG. 4 shows a rear view of the power supply unit's housing without the AC section of FIG. 3 in place.

Referring now to FIG. 4, a rear view of power supply unit 104 is shown without the AC input section 109 in place. As shown, the power supply housing 105 includes a generally open rear portion in which the AC input section 109 is inserted as shown in FIG. 2. A plurality of guide members 134 project from the top of housing 105 into the internal cavity of the housing. The guide members 134 assist the power supplies (such as the one exemplary power supply 110 shown in FIG. 4) to be slid into the housing and connected with the blind mating connectors 130 on the AC input section. The housing 105 also includes a DC distribution circuit board 146 mounted therein, preferably attached by screws and standoffs 144 to the bottom surface of the housing 105. The DC distribution board includes connectors 142 associated with and adapted to mate with corresponding connectors on each of the power supply modules 110. Output DC power from each power supply module 110 is thus provided through the connectors 142 to the DC distribution circuit board 146 which, in turn, provide the DC output voltage to cables 119 (FIG. 1). Each power supply module 110 thus preferably includes two connectors 148, 150 at the rear surface 111 of the module. Connector 148 mates with a corresponding connector 130 on the AC input section 109 and receives AC input power from the AC input section. The other connector 150 mates with a corresponding connector 142 on the DC distribution circuit board 146 and provides DC output power to be provided to other components in the rack 102, such as servers 108. The connectors 148 and 150 and their corresponding mating connectors preferably are blind mating and, if desirable, hot pluggable type connectors, although that need not necessarily be the case. Connectors 130 on the riser board preferably are permitted enough room in holes 131 to pennit easy mating of power supplies 110 to AC input section 109.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A modular AC section for a power supply unit that provides electrical power to a plurality of electrical equipment, comprising:
 a top in which a plurality of holes are formed and into which screws are inserted for attaching said modular AC section to said power supply unit;
 a back adjacent said top;
 a circuit breaker attached either to said top or back;
 a connector attached to said top, said connector adapted to mate with a corresponding connector from a power supply module inserted into the modular power supply unit; and
 wiring that connects said circuit breaker to said connector;
 wherein said AC section is L-shaped.

2. The modular AC section of claim 1 wherein said connector comprises a blind mating connector.

3. The modular AC section of claim 1 wherein said connector comprises a blind mating and hot pluggable connector.

4. The modular AC section of claim 1 further including a plurality of connectors attached to said top and adapted to mate with corresponding connectors from power supply modules inserted into the modular power supply unit.

5. The modular AC section of claim 4 wherein said connectors comprise blind mating connectors.

6. The modular AC section of claim 1 further including a plurality of circuit breakers.

7. The modular AC section of claim 1 further including two AC input connections.

8. The modular AC section of claim 1 wherein said back is perforated.

9. The modular AC section of claim 1 wherein said back is perforated to permit air flow to assist in removing heat from said power supply unit.

10. The modular AC section of claim 1 further including a locator post in said top which mates with a corresponding locator recess in said power supply unit.

11. The modular AC section of claim 1 further including redundant power feeds.

12. A rack of electrical computer equipment, comprising:
 a plurality of computers housed in said rack;
 a power supply unit housed in said rack and providing power to said computers, said power supply unit includes a power supply housing mated to said rack in which a power supply module can be inserted and an AC section that mates to said power supply housing and provides output electrical power, said AC section comprises:
  a top in which a plurality of holes are formed and into which screws are inserted for attaching said AC section to said power supply housing;
  a back adjacent said top;
  a circuit breaker attached either to said top or back;
  a connector attached to said top, said connector adapted to mate with a corresponding connector from a power supply module inserted into the power supply housing; and
  wiring that connects said circuit breaker to said connector;
  wherein said AC section is L-shaped.

13. The rack of electrical computer equipment of claim 12 wherein said connector comprises a blind mating connector.

14. The rack of electrical computer equipment of claim 12 further including a plurality of connectors attached to said top and adapted to mate with corresponding connectors from power supply modules inserted into the power supply housing.

15. The rack of electrical computer equipment of claim 14 wherein said connectors comprise blind mating connectors.

16. The rack of electrical computer equipment of claim 12 further including a plurality of circuit breakers.

17. The rack of electrical computer equipment of claim 12 further including two AC input connections.

18. The rack of electrical computer equipment of claim 12 wherein said back is perforated.

19. The rack of electrical computer equipment of claim 12 wherein said back is perforated to permit air flow to assist in removing heat from said power supply unit.

20. The rack of electrical computer equipment of claim 12 further including power feeds.

21. A rack of electrical computer-equipment, comprising:
 a plurality of computers housed in said rack;
 a power supply unit housed in said rack and providing power to said computers, said power supply unit includes a power supply housing mated to said rack in which a power supply module can be inserted and a modular means for interconnecting AC input power to a power supply module, wherein said modular means is L-shaped.

22. The rack of electrical computer equipment of claim 21 wherein said modular means is screwed to said power supply housing.

23. The rack of electrical computer equipment of claim 21 wherein said modular means comprises redundant power feeds.

* * * * *